(12) United States Patent
Tsai et al.

(10) Patent No.: US 7,015,130 B2
(45) Date of Patent: Mar. 21, 2006

(54) METHOD FOR MAKING UBM PADS AND BUMPS ON WAFER

(75) Inventors: Chi-Long Tsai, Taitung (TW); Min-Lung Huang, Kaohsiung (TW); Chao-Fu Weng, Tainan (TW); En-Chieh Wu, Kaohsiung (TW); Yang Hong-Zen, Kaohsiung (TW)

(73) Assignee: Advanced Semiconductor Engineering, Inc., Kaohsiung (TW)

(*) Notice: Subject to any disclaimer, the term of this patent is extended or adjusted under 35 U.S.C. 154(b) by 149 days.

(21) Appl. No.: 10/716,425

(22) Filed: Nov. 20, 2003

(65) Prior Publication Data

US 2004/0110364 A1    Jun. 10, 2004

(30) Foreign Application Priority Data

Nov. 29, 2002  (TW)  ............................. 091135242 A (51) Int. Cl.
*H01L 21/44*    (2006.01)
(52) U.S. Cl. ...................................... 438/613; 438/614
(58) Field of Classification Search ................ 438/597, 438/612, 613, 614, 615
See application file for complete search history.

(56) References Cited

U.S. PATENT DOCUMENTS

| 5,057,453 | A | * | 10/1991 | Endo et al. .................. 438/614 |
| 5,904,859 | A |   | 5/1999  | Degani |
| 6,130,141 | A |   | 10/2000 | Degani et al. |
| 2004/0259345 | A1 | * | 12/2004 | Yu et al. ..................... 438/613 |

* cited by examiner

*Primary Examiner*—Evan Pert
(74) *Attorney, Agent, or Firm*—Dennison, Schultz, Dougherty & MacDonald

(57) ABSTRACT

A method for making UBM (Under Bump Metallurgy) pads and bumps on a wafer is disclosed. Openings are formed in a photoresist layer for forming bumps, a positive liquid photoresist is provided into the openings of the photoresist layer for forming bumps. The positive liquid photoresist is exposed and developed to modify the openings of the photoresist layer. Thus, bumps formed in the modified openings have precise bonding areas on the UBM layer. Using the bumps as a mask, UBM pads under the bumps are formed by etching the UBM layer, so that the reflowed bumps have a uniform height.

18 Claims, 8 Drawing Sheets

METHOD FOR MAKING UBM PADS AND BUMPS ON WAFER

FIELD OF THE INVENTION

The present invention is generally related to UBM (Under Bump Metallurgy) technology, particularly to a method for making UBM pads and bumps on a wafer.

BACKGROUND OF THE INVENTION

Conventionally, it is usual to connect two electrical devices (such as chip and substrate/film) using conductive bumps by flip-chip bonding or inner lead bonding. It is well known that the bumps on an integrated circuit chip are manufactured while the chip is still in wafer form. There are UBM (Under Bump Metallurgy) pads between the bumps and the bonding pads of the wafer configured to be a bonding interface for enhancing the bonding efficiency between the bonding pads and the bumps.

One of the well known bumping techniques is that the process of forming UBM pads is separated from the process of forming bumps. Normally the bumps are manufactured after completing UBM pads on bonding pads of a wafer.

Figure 1A:
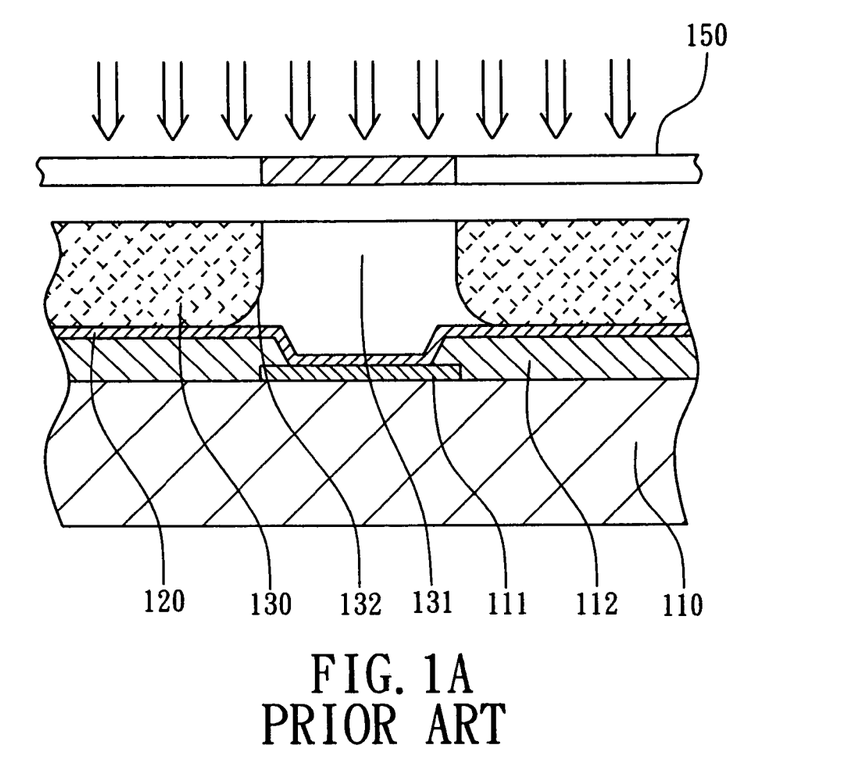
FIG. 1A to FIG. 1D are partial cross-sectional views of a wafer in the steps of a conventional method for making UBM pads and bumps.
Figure 1B:
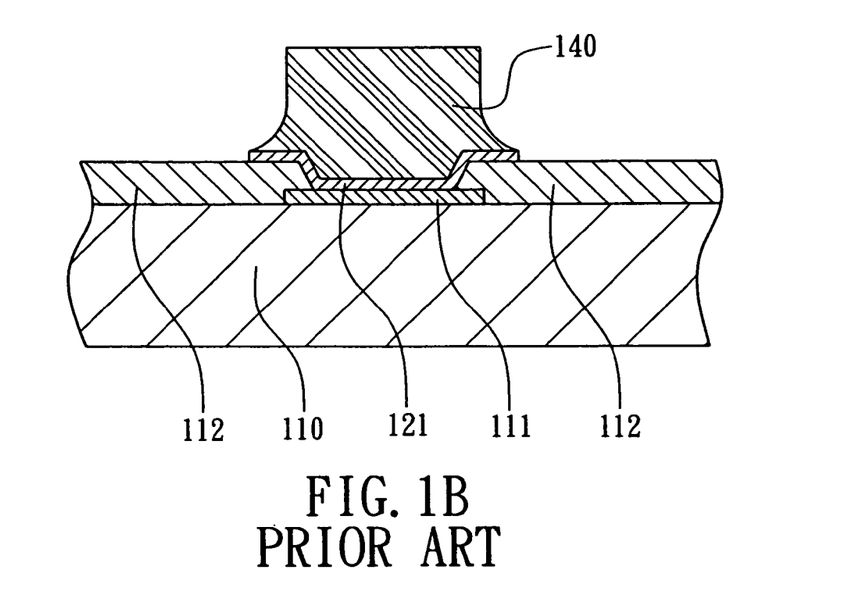
Figure 1C:
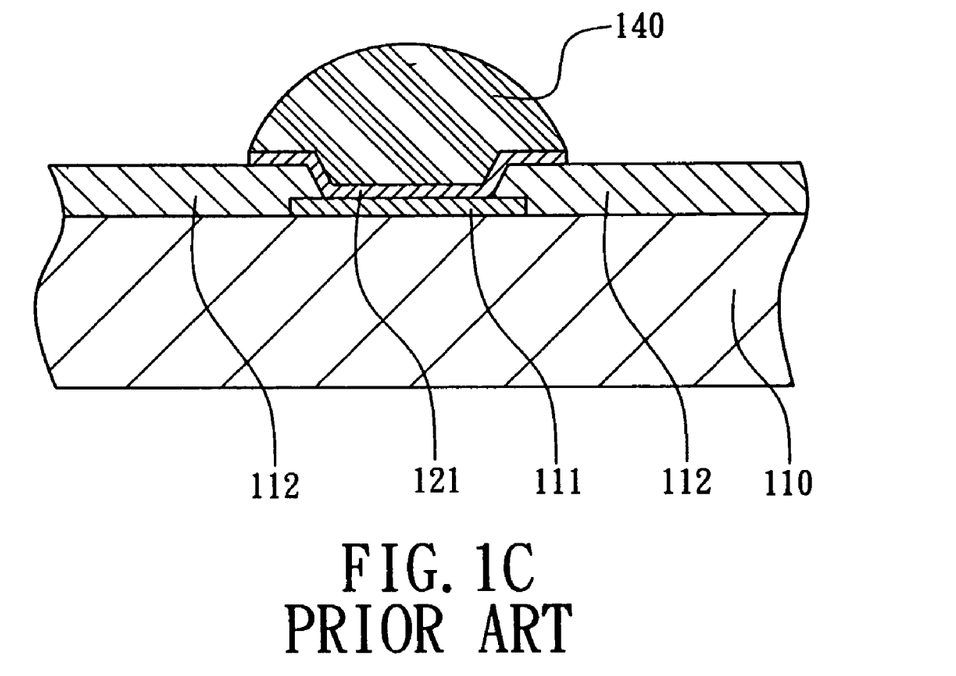
Figure 1D:
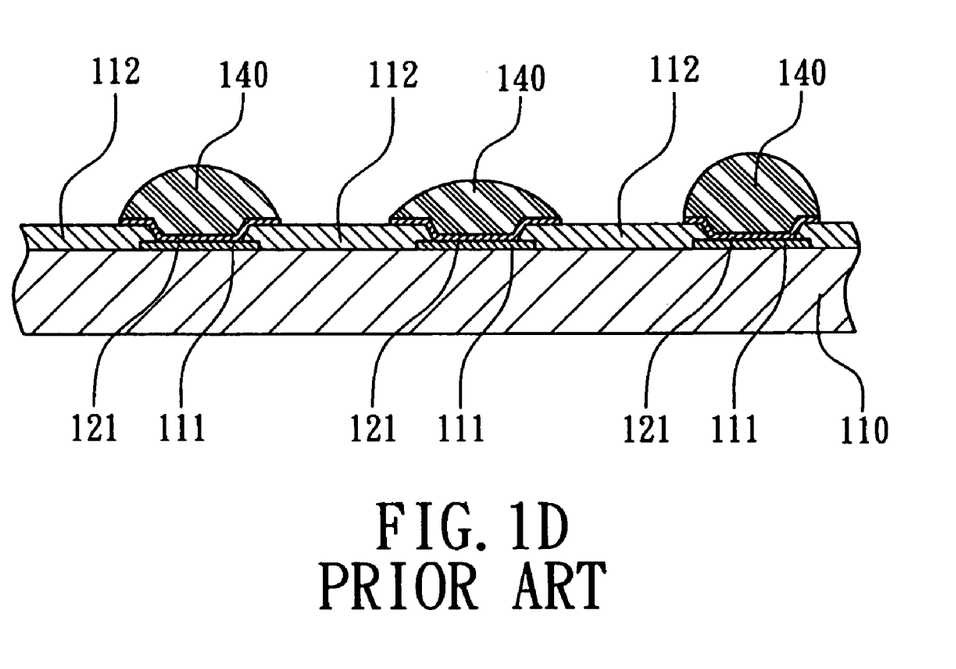

Another prior art method for making UBM pads and bumps is to combine the process of making UBM pads and the process of making bumps in one patterning operation. As shown in FIG. 1A, initially a UBM layer 120 is formed over an entire active surface of a wafer 110 by a sputtering or other deposition method. The UBM layer 120 also covers the bonding pads 111 in addition to the passivation layer 112 of the wafer 110. Then, a dry film 130 is attached to the upper surface of the UBM layer 120. By means of a photomask 150, the dry film 130 is exposed and developed to form a plurality of openings 131 in positions corresponding to the bonding pads 111. Because the dry film 130 is required to have a thickness thick enough for forming bumps 140, there are some uncontrollable reentrant portions 132 formed at the bottom edge of the openings 131 while exposing and developing the dry film 130. As shown in FIG. 1B, a plurality of solder bumps 140 are formed in the openings 131 also formed in the reentrant portions 132 by plating. After the step of exposing and developing the dry film 130, the reentrant portions 132 in the openings 131 with random sizes and shapes are formed at the bottom of the openings 131, so that the bumps 140 have uncontrollably and unequally footprints on the UMB layer 120, i.e. the covering areas that the bumps 140 cover the UMB layer 120 are expanded and difficult to keep in uniform size. Therefore a plurality of UBM pads 121 are formed with uncontrollable areas after etching the UBM layer 120 under the mask of bumps 140. Generally, the thicker the dry film 130 is, the worse precision of the sizes of the UBM pads 121 becomes. As shown in FIGS. 1C and 1D, the reflowed bumps 140 formed by reflowing the bumps 140 wet the corresponding UBM pads 121 to become spherical shapes without equal height. Therefore, the shapes of UBM pads 121 seriously affect the heights of the reflowed bumps 140.

SUMMARY OF THE INVENTION

A first object of the present invention is to provide a method for making UBM pads on a wafer with uniform footprints on a UBM layer. A positive liquid photoresist is formed in openings of photoresist layer for forming bumps in order to fill and modify the openings, so that a plurality of bumps are formed in the modified openings and have uniform footprints on the UBM layer. It is advantageous to form precise UBM pads by etching the UBM layer.

A second object of the present invention is to provide a method for making bumps on a wafer with uniform height. A positive liquid photoresist is formed in openings of photoresist layer in order to fill and modify the openings, so that the modified openings expose the partial UBM layer for forming a plurality of bumps at the following bumping process. Therefore UBM pads under the bumps are defined by etching the UBM layer. Also the bumps on the UBM pads can be reflowed to become uniform and coplanarspherical shape.

A third object of the present invention is to provide a method for making UBM pads and bumps on a wafer. A photoresist layer is formed on a UBM layer on an active surface of a wafer with bonding pads. Openings of the photoresist layer are in locations corresponding to the bonding pads of the wafer, and are filled with a positive liquid photoresist so that reentrant portions of the openings are modified by the positive liquid photoresist. Bumps formed in the openings are precisely bonded on the UBM layer with uniform footprints. Moreover, the bumps are used as an etching mask during etching the UBM layer for forming uniform UMB pads.

In accordance with the present invention, the method for making UBM pads and bumps on a wafer comprises the following steps:

(A) a wafer is provided with an active surface having a plurality of bonding pads thereon;

(B) a UBM (Under Bump Metallurgy) layer is formed over the active surface of the wafer to connect the bonding pads;

(C) a photoresist layer is formed on the UBM layer for forming bumps;

(D) a plurality of openings are created in the photoresist layer in locations corresponding to the bonding pads of the wafer;

(E) a positive liquid photoresist is formed in the openings;

(F) the positive liquid photoresist is exposed and developed for modifying the openings of the photoresist layer;

(G) a plurality of bumps are formed in the modified openings of the photoresist layer, the bumps are bonded onto the UBM layer;

(H) the photoresist layer and the liquid photoresist are removed; and (I) the UBM layer is etched, the UBM layer under the bumps is reserved to form a plurality of UBM pads that are defined by the footprints of the bumps. Therefore, when there is a reentrant portion at the bottom of the openings in the step (D), the positive liquid photoresist is filled into the reentrant portion of the opening in step (E) and modifies the opening in step (F). The photoresist layer is applied as a photomask for the positive liquid photoresist. The unexposed portion of liquid photoresist in the opening is remained in the reentrant portion for filling and modifying the opening, so that the bumps formed in the step (G) have uniformly precise footprints on the UBM layer. It is beneficial to form uniform UBM pads in the step (I). Further, it is better to reflow the bumps after the step (I) to form uniform and coplanar spherical bumps.

DETAILED DESCRIPTION OF THE PRESENT INVENTION

In accordance with the method for making UBM pads and bumps on a wafer of the present invention, the partially cross-sectional views of a wafer are shown from FIG. 2A to FIG. 2K. The steps of the method are described as follows.

Figure 2A:
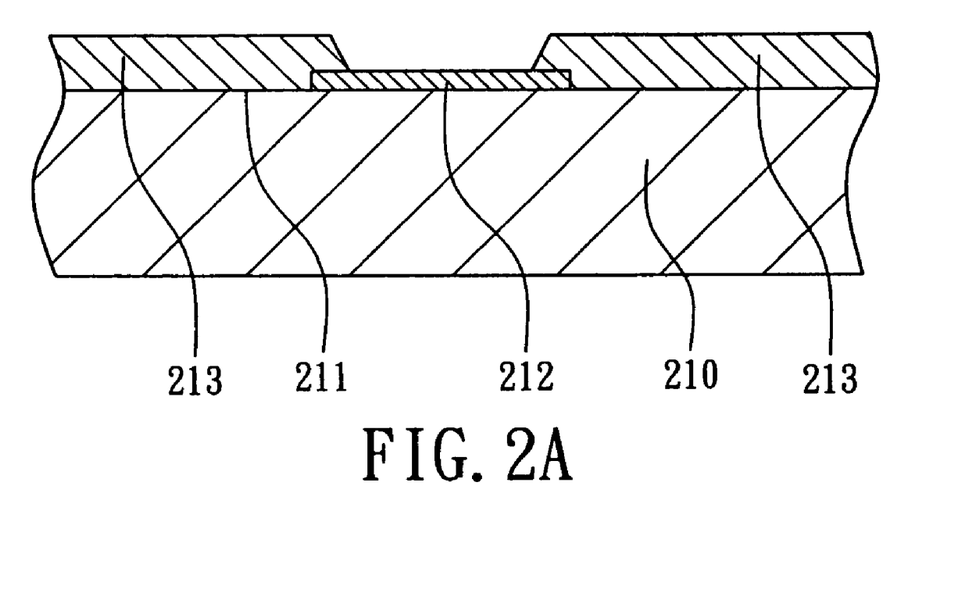
FIG. 2A to FIG. 2K are partial cross-sectional views of a wafer illustrating the processes of making UBM pads and bumps on the wafer in an embodiment according to the method of the present invention.

At first, as shown in FIG. 2A, a wafer 210 having integrated circuits is provided. The wafer 210 has an active surface 211 with a plurality of bonding pads 212 thereon. One of the bonding pads 212 is illustrated in FIG. 2A, in this embodiment, the bonding pads 212 are I/O terminals of signal and power terminals of chips of the wafer 210. A passivation layer 213, such as silicon dioxide, silicon nitride, polyimide, benezo cyclobutene or other low K material, is formed on the active surface 211 of the wafer 210. And, the bonding pads 212 are exposed from the passivation layer 213.

Figure 2B:
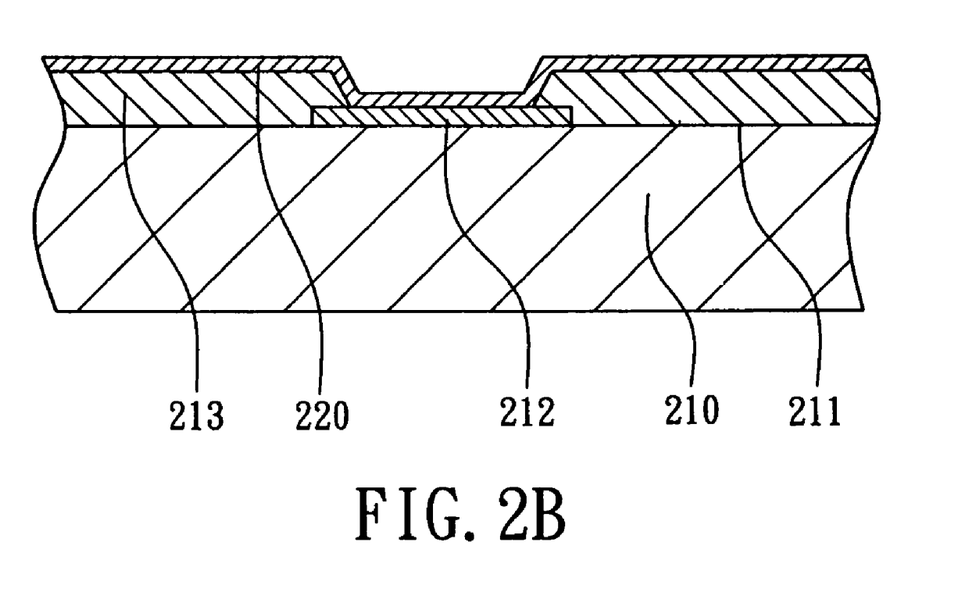

Next, as shown in FIG. 2B, an UBM (Under Bump Metallurgy) layer 220 is formed over the active surface 211 of the wafer 210. In this embodiment, the UBM layer 220 covers the bonding pads 211 and the passivation layer 213. The UBM layer 220 may be formed by electroless plating, sputtering or PVD, CVD deposition method, that is configured to be a bonding interface between bumps and the bonding pads 212 for enhancing the bonding strength between bumps and the bonding pads 212 and preventing metal diffusion. Preferably, the UBM layer 220 is a composite metal layer, such as aluminum/copper, chromium/copper, aluminum/nickel or vanadium/copper.

Figure 2C:
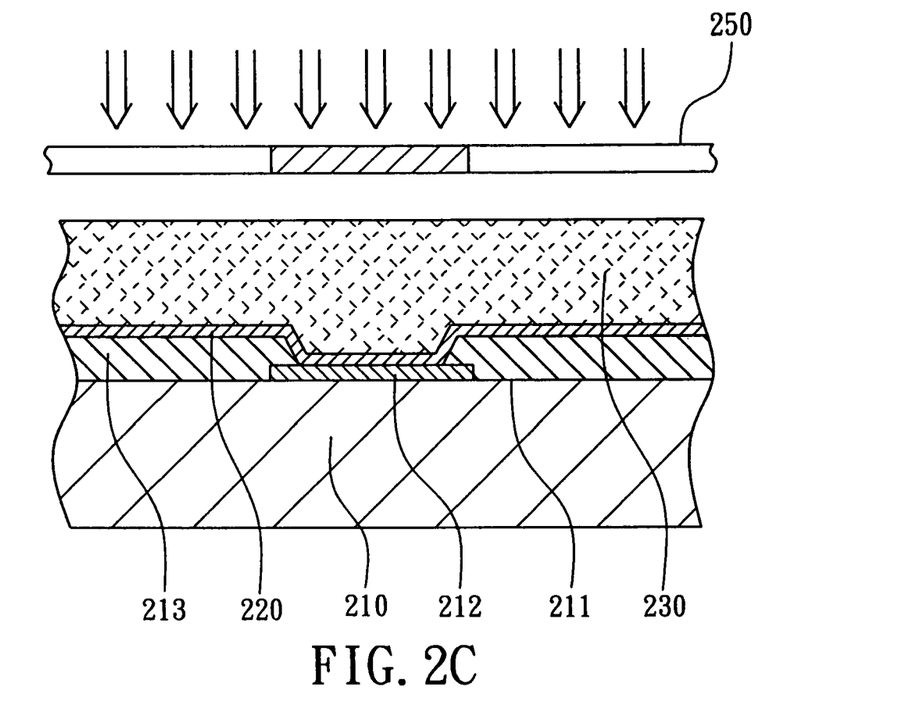
Figure 2D:
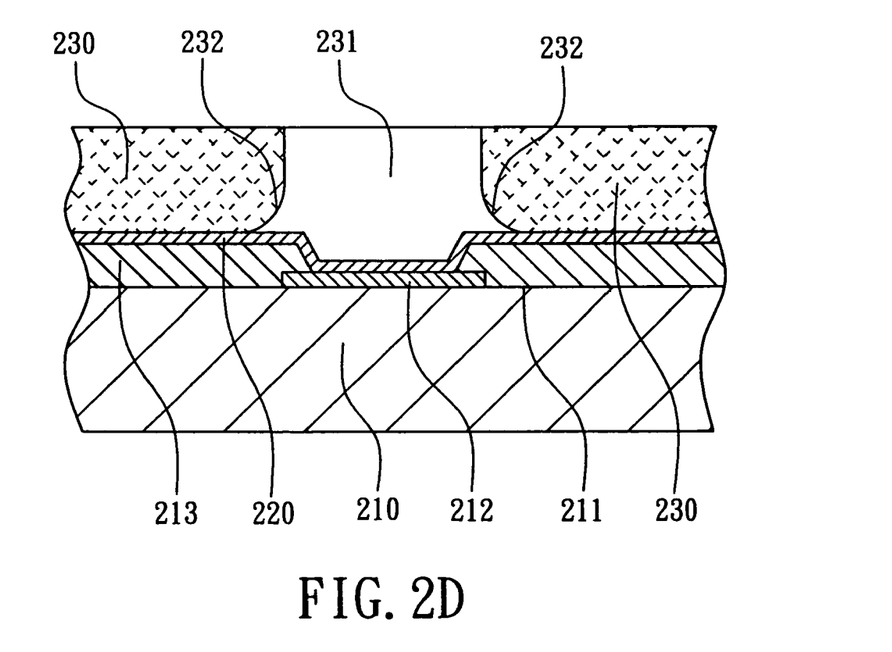

As shown in FIG. 2C, a photoresist layer 230 is formed on the UBM layer 220 for forming bumps. The photoresist layer 230 preferably is a negative photoresist, such as a negative sensitive dry film, which is attached to the UBM layer 220. The method of forming a photoresist layer 230 on the UBM layer 220 may use printing or spin-coating method. It is common that the photoresist layer 230 has a thickness about 3~6 mil. Next, as shown in FIGS. 2C and 2D, a plurality of openings 231 are formed in the bump photoresist layer 230 by means of photolithography technique. As shown in FIG. 2C, a photomask 250 is provided above the wafer 210 to expose the photoresist layer 230 and then develop the photoresist layer 230 to create a plurality of openings 231. The openings 231 are in position corresponding to the bonding pads 212, and expose the UBM layer 220 on the bonding pads 212 of the wafer 210. Generally, the thicker the thickness of the photoresist layer 230 is, the more uncontrollable the bottom edge of openings 231 become. An undesired reentrant portion 232 is usually formed at the bottom edge of the openings 231 (as shown in FIG. 2D).

Figure 2E:
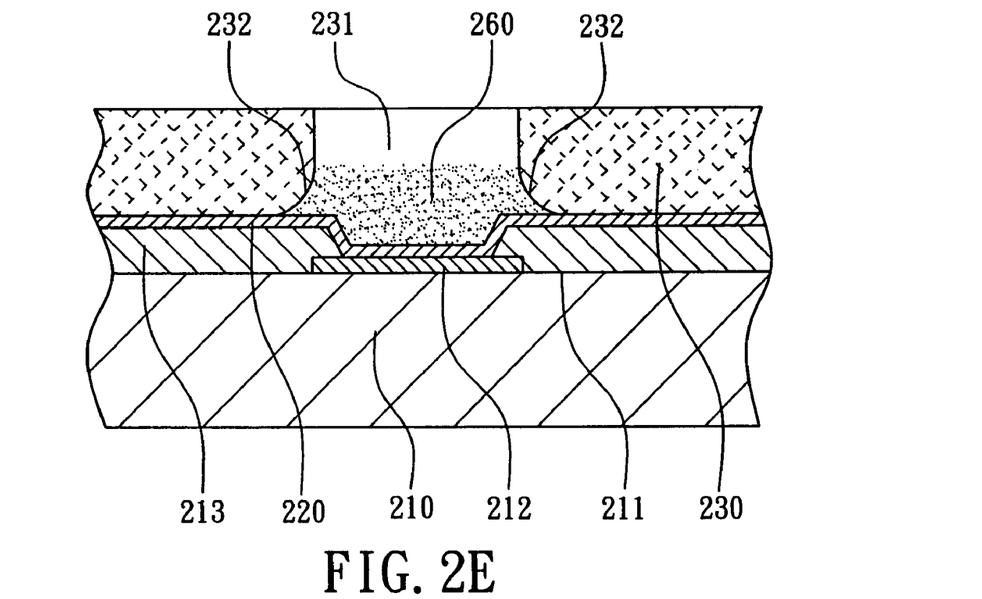

Then, as shown in FIG. 2E, a positive liquid photoresist 260 is formed in the openings 231 by liquid coating method such as printing, spraying, spin-coating or potting. The liquid photoresist 260 is filled into the openings 231 of the photoresist layer 230, also filled into the reentrant portion 232 of the openings 231.

Figure 2F:
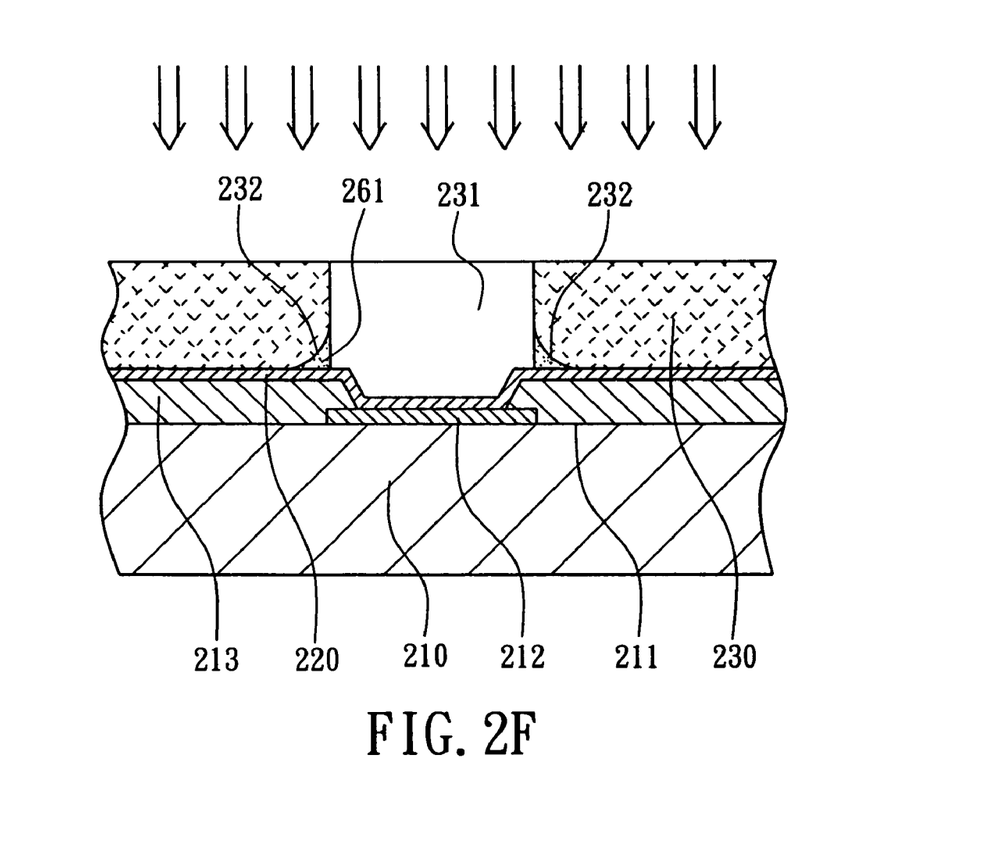

As shown in FIG. 2F, the liquid photoresist 260 is exposed and developed after baking the liquid photoresist 260 for modifying the openings 231 of the photoresist layer 230. In this embodiment, the photoresist layer 230 is used as a mask. The active surface 211 of the wafer 210 is totally exposed during exposing and developing the liquid photoresist 260. It is not necessary to install another photomask above the wafer 210. The photoresist layer 230 is directly used as a photo-mask so that the liquid photoresist 260 has an unexposed portion 261 hidden in the reentrant portion 232 of the opening 231 of the photoresist layer 230. But the others exposed portion of liquid photoresist 260 in the opening 231 are removed after exposure and development. The unexposed portion 261 of liquid photoresist 260 is filled into the reentrant portion 232 of the openings 231 for modifying the openings 231, thereby the exposing area of UBM layer 220 from the openings 231 can be restricted strictly. In this embodiment, the openings 231 of the photoresist layer 230 are filled and modified by the unexposed portion 261 of liquid photoresist 260. Thus the openings 231 have vertical and even cylinders in this embodiment.

Figure 2G:
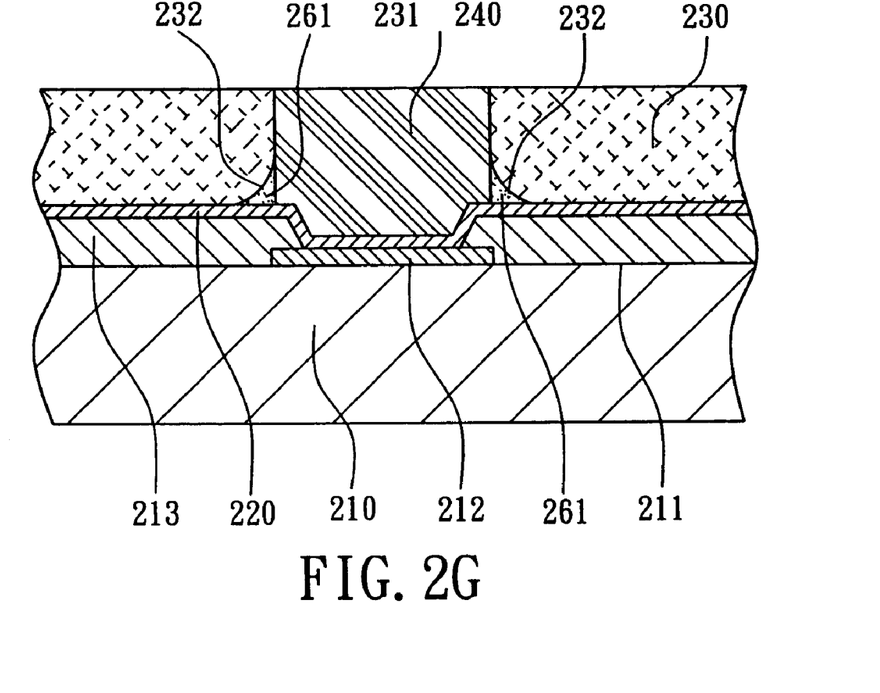

Thereafter, as shown in FIG. 2G, a plurality of bumps 240 are formed in the openings 231 modified by the unexposed portion 261 of the liquid photoresist 260 by wafer plating method or the other bumping method. The bumps 240 are bonded on the UBM layer 220 in cylinder shape. In this embodiment, the bumps 240 are made from reflowable lead-tin alloy.

Figure 2H:
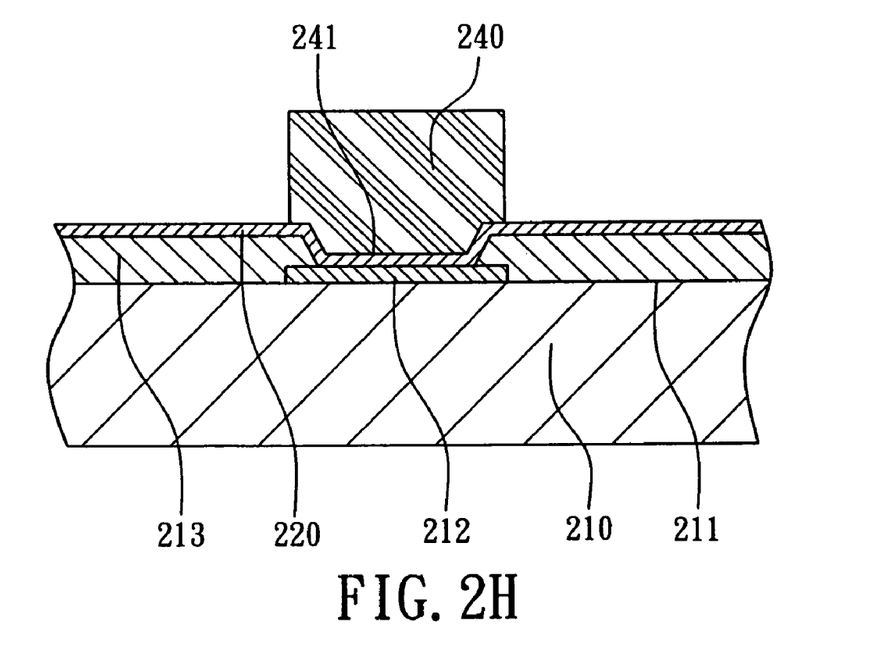
Figure 2I:
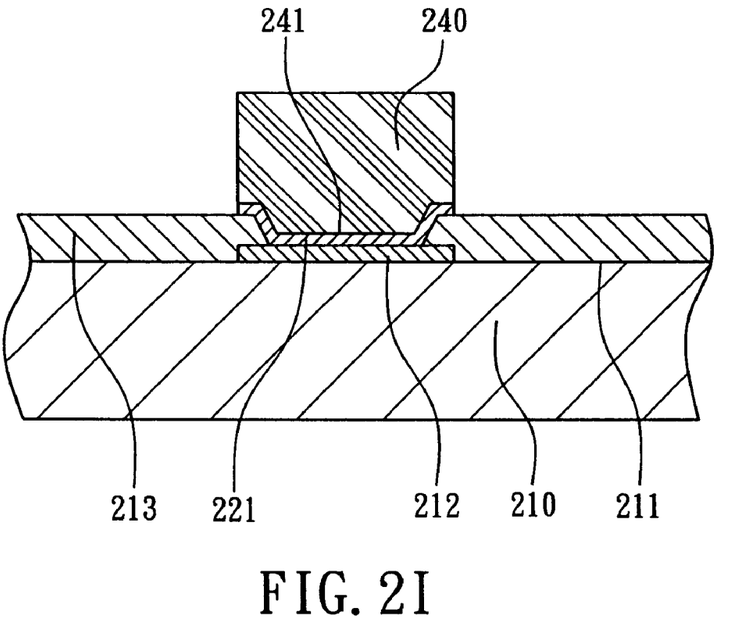

Further as shown in FIG. 2H, the photoresist layer 230 is removed by wet washing or dry plasma stripping method. In this embodiment, the unexposed portion 261 of liquid photoresist 260 is also removed. Then, as shown in FIG. 2I, the UBM layer 220 is etched by plasma etching method and so on. The bumps 240 is used as a mask, the UBM layer 220 under the footprints 241 of the bumps 240 are not etched off to form a plurality of UBM pads 221 under the bumps 240 during etching. Because the bumps 240 have uniform and precise footprints on the UBM layer 220 so that the UBM pads 221 are formed with uniform areas.

Figure 2J:
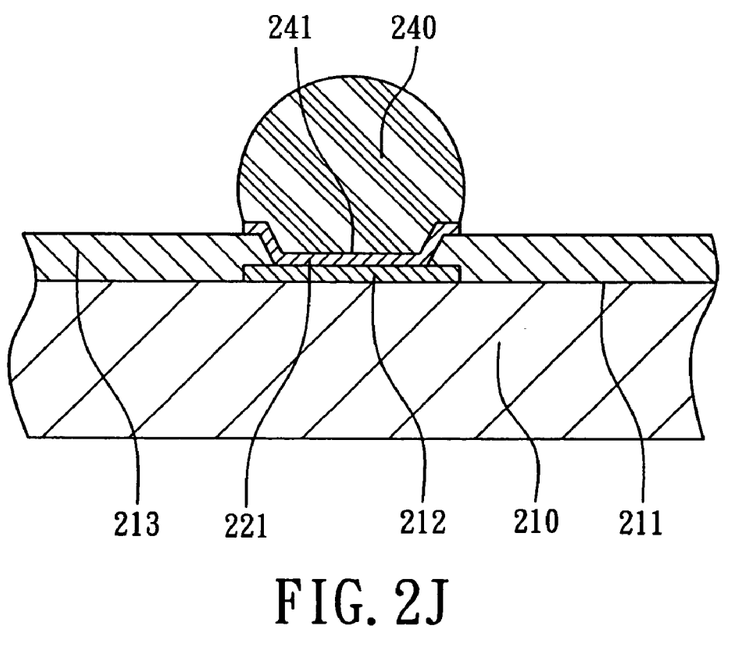
Figure 2K:
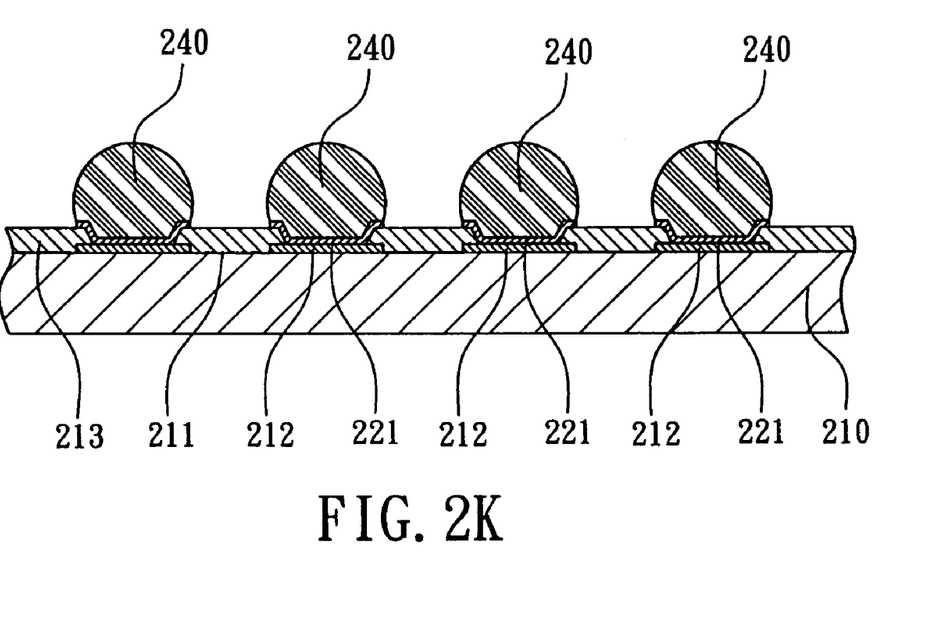

As shown in FIGS. 2J and 2K, it is better to reflow the bumps 240 under high temperature after forming the UBM pads 221. The bumps 240 are reflowed to wet the corresponding UBM pads 221 and reshaped to become reflowed bumps 240 in spherical shape. In accordance with the present invention, the footprints 241 of the bump 240 for forming UBM pads 221 are restricted strictly by the photoresist layer 230 and the liquid photoresist 260 so that the reflowed bumps 240 on the active surface 211 of the wafer 210 have uniform height and excellent coplanarity.

The above description of embodiments of this invention in intended to be illustrative and not limiting. Other embodiments of this invention will be obvious to those skilled in the art in view of the above disclosure.

What is claimed is:

1. A method for making bumps on a wafer, comprising the steps of:
   providing a wafer with an active surface having a plurality of bonding pads thereon; forming an UBM (Under Bump Metallurgy) layer over the active surface of the wafer to connect the bonding pads;
   forming a photoresist layer on the UBM layer;
   creating a plurality of openings in the photoresist layer in locations corresponding to the bonding pads of the wafer;
   forming a liquid photoresist in the openings of the photoresist layer;
   exposing and developing the liquid photoresist for modifying the openings of the photoresist layer;
   forming a plurality of bumps in the openings in photoresist layer, the bumps being bonded onto the UBM layer;
   removing the photoresist layer and the liquid photoresist;
   etching the UBM layer to form a plurality of UBM pads under the bumps, using the bumps as a mask; and
   reflowing the bumps on the UBM pads.

2. The method in accordance with claim 1, wherein the openings has at least a reentrant portion.

3. The method in accordance with claim 2, wherein the liquid photoresist is filled in the reentrant portion of the openings after the exposing and developing step of the liquid photoresist.

4. The method in accordance with claim 1, wherein the liquid photoresist is positive type.

5. The method in accordance with claim 4, wherein the photoresist layer is negative type.

6. The method in accordance with claim 4, wherein the liquid photoresist is patterned by using the photoresist layer as a mask.

7. The method in accordance with claim 1, wherein the photoresist layer is a dry film layer formed by attaching method.

8. The method in accordance with claim 1, wherein the thickness of the photoresist layer is between 3~6 mil.

9. The method in accordance with claim 1, wherein the UBM layer is etched by plasma etching method.

10. A method for making bumps on a wafer comprising the steps of:
   providing a wafer with an active surface having a plurality of bonding pads thereon;
   forming an UBM (Under Bump Metallurgy) layer over the active surface of the wafer to connect the bonding pads; forming a photoresist layer on the UBM layer;
   creating a plurality of openings in the photoresist layer in locations corresponding to the bonding pads of the wafer;
   forming a liquid photoresist in the openings of the photoresist layer;
   exposing and developing the liquid photoresist for modifying the openings of the photoresist layer;
   forming a plurality of bumps in the openings in the photoresist layer, the bumps being bonded onto the UBM layer;
   removing the bump photoresist layer and the liquid photoresist; and
   etching the UBM layer to form a plurality of UBM pads under the bumps, using the bumps as a mask.

11. The method in accordance with claim 10, wherein the openings has at least a reentrant portion.

12. The method in accordance with claim 11, wherein the liquid photoresist is positive type.

13. The method in accordance with claim 12, wherein the liquid photoresist is patterned by using the photoresist layer as a mask so as to be filled in the reentrant portion of the openings.

14. The method in accordance with claim 12, wherein photoresist layer is negative type.

15. A method for making a bump comprising the steps of:
   providing a substrate with a surface;
   forming a metal layer over the surface of the substrate;
   forming a first photoresist on the metal layer;
   creating an opening in the first photoresist layer, the opening having a reentrant portion;
   forming a second photoresist in the opening and the reentrant portion of the first photoresist;
   exposing and developing the second photoresist for modifying the openings of the first photoresist;
   forming a bump in the modified opening in the first photoresist, the bump being bonded onto the metal layer;
   removing the first photoresist and the second photoresist; and
   etching the metal layer to form a pad under the bump, using the bump as a mask.

16. The method in accordance with claim 15, wherein the second photoresist is positive type.

17. The method in accordance with claim 16, wherein the second photoresist is patterned by using the first photoresist as a mask so as to be filled in the reentrant portion of the opening.

18. The method in accordance with claim 16, wherein the first photoresist is negative type.

* * * * *